(12) United States Patent
Marreiro et al.

(10) Patent No.: US 9,337,178 B2
(45) Date of Patent: May 10, 2016

(54) METHOD OF FORMING AN ESD DEVICE AND STRUCTURE THEREFOR

(71) Applicant: SEMICONDUCTOR COMPONENTS INDUSTRIES, LLC, Phoenix, AZ (US)

(72) Inventors: David D. Marreiro, Oakland, CA (US); Yupeng Chen, San Jose, CA (US); Ralph Wall, Pocatello, ID (US); Umesh Sharma, San Jose, CA (US); Harry Yue Gee, Santa Clara, CA (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 171 days.

(21) Appl. No.: 14/049,501

(22) Filed: Oct. 9, 2013

(65) Prior Publication Data

US 2014/0159108 A1  Jun. 12, 2014

Related U.S. Application Data

(60) Provisional application No. 61/735,036, filed on Dec. 9, 2012.

(51) Int. Cl.
*H01L 27/02* (2006.01)

(52) U.S. Cl.
CPC ........ *H01L 27/0248* (2013.01); *H01L 27/0262* (2013.01)

(58) Field of Classification Search
CPC ............... H01L 27/0255; H01L 29/41741; H01L 29/41766; H01L 29/41775; H01L 29/7809

See application file for complete search history.

(56) References Cited

U.S. PATENT DOCUMENTS

| | | | |
|---|---|---|---|
| 3,882,529 A | 5/1975 | Warner, Jr. | |
| 4,819,052 A * | 4/1989 | Hutter | H01L 21/743 257/374 |
| 5,155,562 A * | 10/1992 | Tsuchiya | H01L 29/7398 257/343 |
| 5,500,546 A | 3/1996 | Marum et al. | |
| 5,850,095 A | 12/1998 | Chen et al. | |
| 5,872,379 A | 2/1999 | Lee | |
| 6,015,999 A | 1/2000 | Yu et al. | |
| 6,373,100 B1 * | 4/2002 | Pages | H01L 29/7809 257/329 |
| 6,448,123 B1 | 9/2002 | Lee et al. | |
| 6,489,660 B1 | 12/2002 | Einthoven et al. | |
| 6,909,149 B2 * | 6/2005 | Russ | H01L 29/7436 257/173 |
| 6,914,298 B1 * | 7/2005 | Hamazawa | H01L 29/0878 257/343 |
| 7,538,395 B2 * | 5/2009 | Keena | H01L 27/0255 257/101 |

(Continued)

*Primary Examiner* — John C Ingham
*Assistant Examiner* — Ismail Muse
(74) *Attorney, Agent, or Firm* — Robert F. Hightower

(57) ABSTRACT

In one embodiment, an ESD device is configured to include a trigger device that assists in forming a trigger of the ESD device. The trigger device is configured to enable a transistor or a transistor of an SCR responsively to an input voltage having a value that is no less than the trigger value of the ESD device.

14 Claims, 7 Drawing Sheets

(56) References Cited

U.S. PATENT DOCUMENTS

| | | | |
|---|---|---|---|
| 7,579,632 B2* | 8/2009 | Salih | H01L 23/60 257/173 |
| 7,666,751 B2 | 2/2010 | Marreiro et al. | |
| 7,781,826 B2 | 8/2010 | Mallikararjunaswamy et al. | |
| 7,812,367 B2* | 10/2010 | Salih | H01L 27/0255 257/106 |
| 7,842,969 B2 | 11/2010 | Marreiro et al. | |
| 8,039,359 B2* | 10/2011 | Keena | H01L 27/0255 257/106 |
| 8,236,625 B2 | 8/2012 | Salih et al. | |
| 8,274,130 B2 | 9/2012 | Mihnea et al. | |
| 8,796,731 B2* | 8/2014 | Abou-Khalil | H01L 27/0262 257/173 |
| 2005/0145945 A1* | 7/2005 | Zdebel | H01L 27/0255 257/355 |
| 2005/0212051 A1* | 9/2005 | Jozwiak | H01L 29/7436 257/355 |
| 2010/0219463 A1* | 9/2010 | Cheng | H01L 29/0653 257/329 |
| 2010/0244090 A1* | 9/2010 | Bobde | H01L 27/0259 257/112 |
| 2010/0314660 A1* | 12/2010 | Salih | H01L 27/0255 257/173 |
| 2011/0127602 A1* | 6/2011 | Mallikarjunaswamy | H01L 21/823807 257/331 |
| 2011/0176244 A1* | 7/2011 | Gendron | H01L 27/0259 361/56 |
| 2011/0210418 A1* | 9/2011 | Esmark | H01L 23/60 257/517 |
| 2012/0168900 A1* | 7/2012 | Bobde | H01L 29/407 257/522 |
| 2013/0093057 A1* | 4/2013 | Yamaoka | H01L 27/0259 257/565 |

* cited by examiner

METHOD OF FORMING AN ESD DEVICE AND STRUCTURE THEREFOR

PRIORITY CLAIM TO PRIOR PROVISIONAL FILING

This application claims priority to prior filed Provisional Application No. 61/735,036 entitled "SEMICONDCUTOR DEVICE AND METHOD" filed on Dec. 9, 2012, having a docket number of ONS01572, and having common inventors Marreiro et al.

BACKGROUND OF THE INVENTION

The present invention relates, in general, to electronics, and more particularly, to semiconductors, structures thereof, and methods of forming semiconductor devices.

In the past, the semiconductor industry utilized various methods and structures to form electrostatic discharge (ESD) protection devices. In some application, ESD devices may be used for protection of circuits connected to high-speed serial data interfaces, such as HDMI, USB3.0 and the like, which may operate at high data rates upwards of 3 Gbps. The ESD devices used to protect the signal lines generally should have a low capacitance and insertion loss to maintain signal integrity. The normal operating voltage levels on the signal lines continues to decrease with advancing technology. Some prior ESD protection circuits had a relatively high clamping voltage during ESD transients, and could also have relatively high dynamic resistance (Rdyn). The high clamping voltages could result in damaging the transceivers and/or other devices connected to the signal lines.

Accordingly, it is desirable to have an electrostatic discharge (ESD) device that has a low capacitance, that reacts to both a positive and a negative ESD event, that has a low clamp voltage, that is easy to control in manufacturing, that has a clamp voltage that can be controlled, and/or that has a low dynamic resistance.

Figure 1:
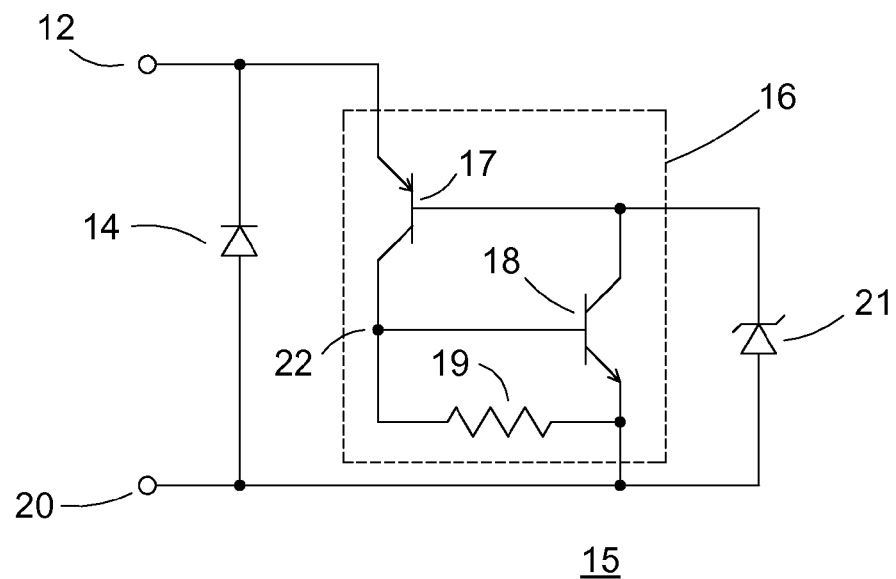
FIG. 1 schematically illustrates an embodiment of a portion of an electrostatic discharge (ESD) protection device or ESD device in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements are omitted for simplicity of the description. As used herein current carrying electrode means an element of a device that carries current through the device such as a source or a drain of a MOS transistor or an emitter or a collector of a bipolar transistor or a cathode or anode of a diode, and a control electrode means an element of the device that controls current through the device such as a gate of a MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, and that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description illustrates a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

DETAILED DESCRIPTION OF THE DRAWINGS

FIG. 1 schematically illustrates an embodiment of a portion of an electrostatic discharge (ESD) protection device or ESD device 15 that has a low clamp voltage, a low capacitance and a low dynamic resistance. Device 15 includes two terminals, an input terminal or input 12 and a second terminal, such as a common return, 20. Device 15 is configured to provide ESD protection between input 12 and terminal 20 and to form a low clamp voltage therebetween. Device 15 is also configured to have a low capacitance between input 12 and terminal 20.

Device 15 includes an input diode 14, two transistors 17 and 18 that are formed in a configuration of a silicon controlled rectifier (SCR), and a threshold device or trigger device 21. The SCR configuration is illustrated in a general manner by element 16. In one embodiment, device 21 may be formed as a zener diode, in other embodiments device 21 may be a other devices that form the trigger voltage such as a P-N diode or a group of series connected P-N diodes.

In normal operation, device 15 is biased to a normal operating voltage, such as a voltage that is between about the trigger voltage of device 21 and approximately eight tenths of a volt (0.8V) to three and three tenths volts (3.3V), as a non-limiting example, such as by applying a bias voltage to input 12 and a ground reference voltage to terminal 20. Because of the hereinafter described characteristics of device 15, the capacitance of device 15 remains low as the voltage between input 12 and terminal 20 varies over this normal operating voltage. However, those skilled in the art will understand that the capacitance of an ESD device is customarily specified with zero volts applied across the device. This zero voltage condition is normally referred to as a zero bias condition. As will be seen further hereinafter, at this zero bias condition the hereinafter described low capacitance features of device 15 forms very low capacitance values for a diode 14 and device 15.

Figure 2:
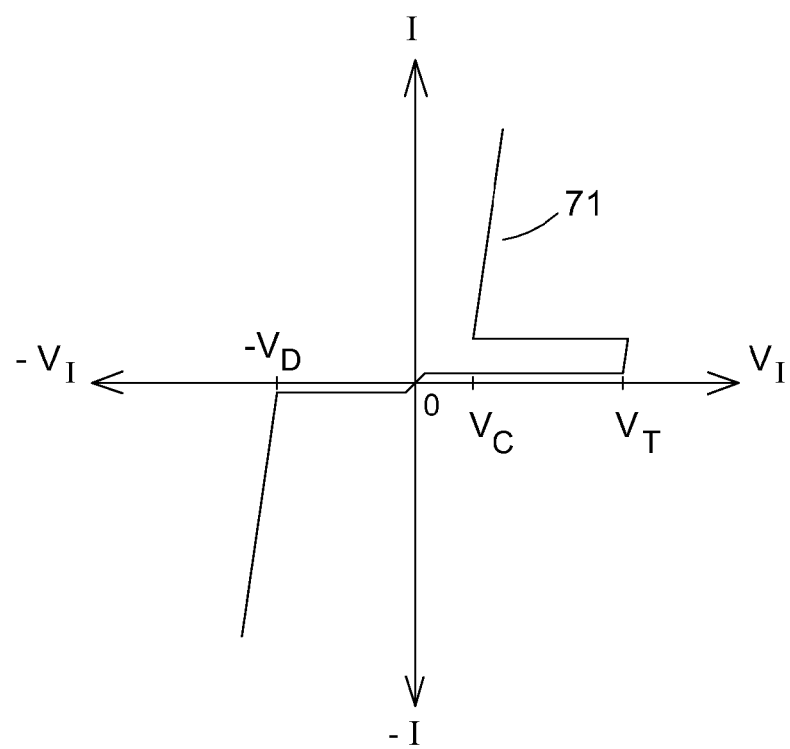
FIG. 2 is a graph that illustrates an example of a V-I characteristic of the ESD device of FIG. 1 in accordance with the present invention.

FIG. 2 is a graph 71 that illustrates an example of a V-I characteristic during operation of an example embodiment of device 15. The abscissa indicates the voltage between input 12 and terminal 20 and the ordinate indicates current flow into input 12. A point labeled Vt illustrates an example of a trigger voltage of device 15. This description has references to FIG. 1 and FIG. 2.

During a positive ESD, the voltage between input 12 and terminal 20 increases. As the ESD voltage on input 12 increases but is less than the trigger voltage of device 15, a low value ESD current can flow from input 12 to terminal 20. This ESD current is illustrated in FIG. 2 as the current value between a voltage of zero (0) volts and the point Vt. A first portion of the ESD current can flow from input 12 to the base of transistor 17 and to terminal 20 via the emitter-base junction of transistor 17 and a reverse-biased junction of device 21. A second portion of the ESD current from input 12 can flow from input 12 and through the emitter-to-collector of transistor 17 as a result of the normal transistor effect.

When the voltage on input 12 reaches the trigger voltage of device 21, thus of device 15, such as illustrated at point Vt, device 21 becomes enabled and begins to conduct a large current. For the embodiment of a zener diode for device 21, the voltage on input 12 reaches the zener voltage and the zener diode may begin to operate in avalanche mode to conduct the large current. The increased current flow through device 21 enables transistor 17 which causes transistor 18 to begin to conduct a large current. In one embodiment, transistor 17 may be configured to have a high current gain to facilitate such operation. The increased current flow through transistor 17 flows through resistor 19 to terminal 20. The current flow increases the voltage drop across resistor 19 which eventually becomes large enough to enable transistor 18. Transistor 18 then also conducts current from the base of transistor 17 to terminal 20.

With transistors 17 and 18 both enabled, a self-sustained conduction path may be formed such as is formed in an SCR. This conduction path can carry the entirety of the ESD current from input 12 through the emitter-base junction of transistor 17 and through transistor 18 both of which now operate in substantially a saturated condition. The voltage drop across input 12 to terminal 20 reduces to the clamp voltage (Vc) of device 15 as illustrated by graph 71 at a voltage Vc. The voltage from input 12 to terminal 20 becomes the emitter-base drop of transistor 17 and the saturation voltage of transistor 18. This voltage generally is much less than the trigger voltage (Vt) of device 15 as illustrated by graph 71. In one embodiment, the clamp voltage (Vc) may be two volts (2V) or less. Consequently, during an ESD event, device 15 can effectively clamp input 12 to a safe, low voltage level.

As the ESD pulse is terminating and most of the ESD charge has been conducted to terminal 20, the ESD current into input 12 can reach a lower value referred to as the holding current (IH). This holding current typically is the ESD current that continues to flow for a period of time as the ESD event is dissipating. The holding current may not be sufficient to keep transistor 18 enabled. As the ESD pulse further decays, the voltage on input 12 may decrease to a value that is less than the trigger voltage (Vt) of device 15, such as less than the trigger voltage of device 21. As a result of the reduced voltage on input 12, device 21 no longer conducts current and transistor 17 also becomes disabled. Therefore, device 15 substantially terminates conducing current and returns to a substantially non-conducting state. Those skilled in the art will appreciate that device 15 may conduct some value of leakage current during the substantially non-conducting state. At this voltage the leakage current through device 21 may be very low. In one embodiment, transistor 17 may be formed to have a current gain such that the collector current of transistor 17 in the normal operating mode may be substantially less than a leakage current specification for the system in which device 15 is used.

In normal operation, when no ESD pulse is present, device 15 remains substantially non-conducting for input voltages, such as the voltage between input 12 and terminal 20, that are less than the trigger voltage (Vt).

When a negative polarity ESD event happens, the voltage at input 12 becomes negative with respect to return 20 which causes diode 14 to be forward biased while reverse biasing the emitter base junction of transistor 17. Thus, transistor 17 is disabled, and no current flows through its emitter terminal. All the ESD current is conducted through diode 14 in the forward operating region of diode 14 which provides device 15 with a low clamp voltage from return 20 to input 12 during negative ESD events.

In one embodiment, device 21, thus device 15, is formed to have a trigger voltage that is greater than approximately three and three tenths volts (3.3V) which may be a typical supply voltage for an application such as a high speed transmission line, HDMI signal, etc. For such an embodiment, the leakage current of device 15 may be no greater than approximately one (1) micro-ampere. In one another embodiment, device 21 may be formed to have a trigger voltage of approximately five to ten volts (5-10V).

Figure 3:
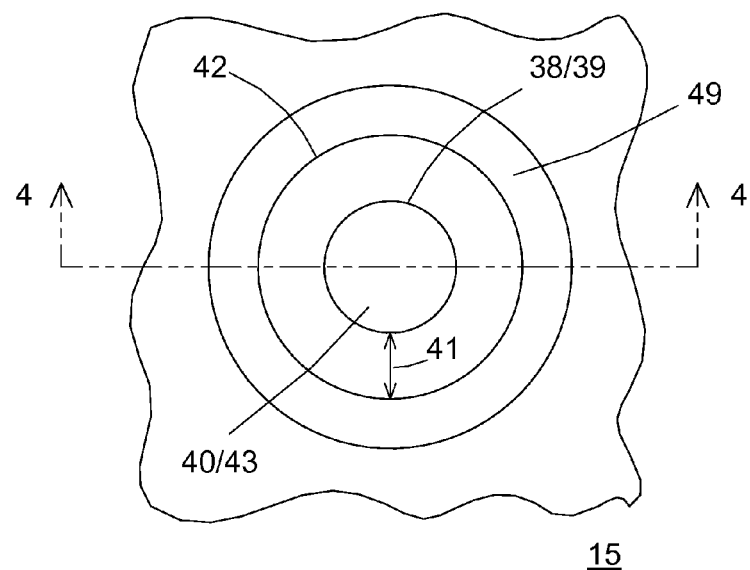
FIG. 3 illustrates an enlarged plan view of an example of an embodiment of a portion of the ESD device of FIG. 1 in accordance with the present invention.

FIG. 3 illustrates an enlarged plan view of an example of an embodiment of a portion of device 15.

Figure 4:
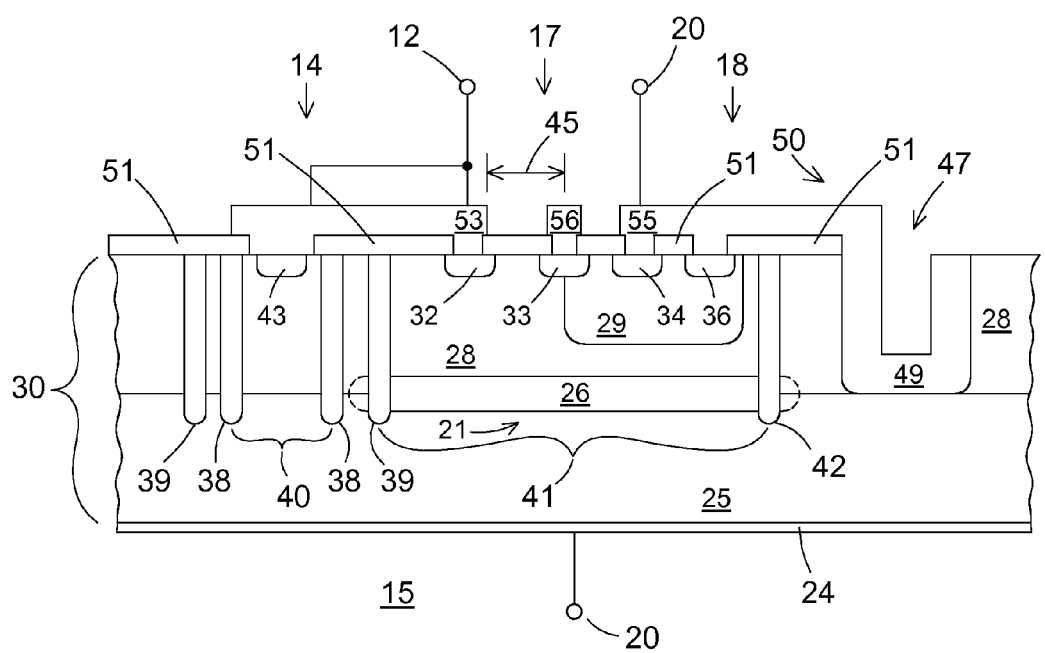
FIG. 4 illustrates an example of an embodiment of a cross-sectional view of the ESD device of FIGS. 1 and 3 in accordance with the present invention.

FIG. 4 illustrates an example of an embodiment of a cross-sectional view of device 15 along cross-section lines 4-4. This description has references to FIGS. 1-4. Device 15 is formed on a semiconductor substrate 30. Substrate 30 may include a bulk semiconductor substrate 25 and a first semiconductor layer 28 that may be formed on substrate 25. A semiconductor region 26 may be formed near the interface of the dopants that form layer 28 and the dopants of substrate 25 in order to form the zener diode embodiment of device 21. Isolation structures 38 and 42, and optional structure 39 may be formed to isolate portions of layer 28 from each other. Structure 42 may be formed as a closed polygon with a periphery that has an opening which encloses or surrounds a portion of layer 28, thus, structure 42 may be regarded as a multiply-connected domain. Similarly, structure 38 may be formed as another closed polygon with another periphery that has an opening which encloses or surrounds another portion of layer 28, thus structure 38 may also be regarded as a multiply-connected domain. Optional structure 39 may be formed to enclose an additional portion of layer 28 as will be explained further hereinafter. For the embodiment where structure 39 is omitted, region 41 may extend between structure 42 and structure 38. Each of structures 42 and 38 and/or 39 may be viewed as a blocking structure that minimizes electrical coupling between the enclosed portions and other portions of device 15. For example, structure 38 forms an isolation region 40 where diode 14 is formed and structure 42 forms an isolation region 41 where transistors 17-18 and device 21 are formed. Those skilled in the art will appreciate that in most embodiments, structure 42 also surrounds and encloses region 40. FIG. 3 illustrates the multiply-connected characteristic of structures 38 and 42. Although device 15 is illustrated and explained herein as a circular device, such as symmetrical around diode 14 and/or region 43, those skilled in the art will understand that structures 38, 39, and 42 may also be formed as a linear or serpentine topology where one or all of structures 38, 39, and 42 extend perpendicular to the page of FIG. 4 and at some point also extend laterally across the plane of FIG. 4 to form a parallelogram that encloses a portion of layer 28.

A conductor 24 may be formed on an opposite surface, for example a bottom surface, of substrate 25 to facilitate forming a low resistance connection to elements of device 15 such as the zener diode in the embodiment of device 21 being a zener diode.

Device 15 also includes a semiconductor region 29 that is formed within region 41 such as the portion of layer 28 enclosed by structure 42. Region 29 forms a collector of transistor 17 and a base of transistor 18, thus a connection therebetween. A semiconductor region 34 is formed within region 29 to form an emitter of transistor 18. Another semiconductor region 36 may be formed within region 29 to assist in forming a low resistance electrical connection to region 29. Such areas as region 36 usually are referred to as a contact region. An electrical connection is made to the base of transistor 18 through region 36 and region 29. The portion of region 29 that is between region 36 and the junction with region 34 forms resistor 19. A semiconductor region 32 may be formed in region 41 and external to region 29 such that region 32 is spaced apart from region 29. In one embodiment, region 32 is spaced laterally apart from region 29. Region 32 forms an emitter of transistor 17.

An optional semiconductor region 33 may also be formed within region 41 to assist in controlling the gain of transistor 17 as will be seen further hereinafter. Region 33 may be formed a distance 45 from the edge of region 29 and so that at least a portion of region 33 is positioned between regions 29 and 32. In some embodiments, distance 45 may be zero so that region 33 may abut or extend into region 29. In another embodiment, the value of distance 45 may result in region 33 being spaced apart from region 29, such as spaced laterally apart. As the value of distance 45 is reduced, it reduces the breakdown voltage of the collector-base junction of transistor 17 which also changes the trigger voltage (Vt) of device 15. Thus, changing distance 45 facilitates changing the trigger voltage without having to change the actual structure of the interconnections and the device structure (except for distance 45) of device 15.

Diode 14 may be formed in region 40. A semiconductor region 43 may be formed within layer 28 and positioned so that the periphery of region 40, such as the periphery at the surface of layer 28, is completely surrounded by structure 38. The interface of layer 28 and substrate 25 within region 40 forms diode 14. In most embodiments, region 43 forms a doped region that facilitates forming a low resistance electrical contact (typically referred to as an ohmic contact) between the portion region 28 within region 40 and conductor 53. Region 43 typically has a very shallow depth to assist in reducing the capacitance of diode 14. Because structure 38 extends through layer 28, it reduces the amount of layer 28 that is near region 43 thereby assisting in reducing the capacitance of diode 14. Structure 38 also assists in isolating region 26 from region 40 thereby further assisting in reducing the capacitance of diode 14. In one embodiment, the doping concentration of layer 28 is formed to be no greater than approximately 1E13 to minimize the input capacitance. In another embodiment, the peak doping concentration of layer 28 is formed to be approximately 1E13. In another embodiment the doping concentration of layer 28 may be between 1E12 and 1E14. Because structure 42 extends through layer 28 and through region 26, it assists in minimizing the leakage current of device 15, such as from region 26 to region 25. Those skilled in the art realize that in some embodiments it may be difficult to determine where the outer edge of region 26 is positioned as illustrated by dashed lines. In such an embodiment, optional structure 39 may be positioned between structure 38 and region 32 to assist in forming region 41 and structure 38 may be used to isolate region 40 and diode 14 from region 26.

In the one embodiment, region 43 has a peak doping concentration that is greater than the peak doping concentration of layer 28. In another embodiment, the peak doping concentration of region 43 is greater than the doping concentration of substrate 25.

In one embodiment, substrate 25 is P-type while layer 28 and region 26 are N-type. For this embodiment, regions 29 and 36 may be P-type, regions 33 and 34 may be N-type, and region 32 may be P-type. Typically, the doping concentration of region 26 may be greater than the doping concentration of layer 28. The doping concentration of layer 28 may be lower to assist in reducing the input capacitance of device 15 between input 12 and return 20. The lower doping concentration of layer 28 could cause transistor 17 to have a high gain. Region 33 may assist in controlling the gain of transistor 17. Region 33 generally has a high doping concentration in order to reduce the gain of transistor 17. Region 33 may also assist in minimizing parasitic conduction along the surface of layer 28. Region 33 may be formed distance 45 from region 29 to minimize any effect to the base-collector breakdown voltage of transistor 17. Region 33 may also be formed a distance from region 32 to minimize the emitter-base junction capacitance of transistor 17.

In one embodiment, substrate 25 is formed with a P-type conductivity having a doping concentration that is approximately 1E18-1E19. In this embodiment, region 26 is formed as an N-type having a doping concentration that is approximately 1E17 to 1E19. In one embodiment, region 29 is formed as a P-type region having a peak doping concentration of approximately 1E16 to 1E17, and regions 32-34 and 43 have a peak doping concentration of approximately 1E19-1E20. Region 36 may have a peak doping concentration of approximately 1E19-1E20.

Device 15 may also include a low resistance contact between substrate 25 and elements on the surface of substrate 30. The low resistance electrical connection may include a conductor 49 with a portion of conductor 49 formed in an opening that extends through layer 28 to a portion of the surface of substrate 25. The portion of conductor 49 in the opening physically and electrically contacts the portion of substrate 25 and forms a low resistance electrical connection thereto. Another portion 50 of conductor 49 extends from within the opening onto the surface of substrate 30 and forms a low resistance electrical connection to elements of device 15. For example, portion 50 may form a low resistance electrical connection to region 29 through region 36 or may form a low resistance electrical connection to region 34. Conductor 49 reduces the dynamic resistance of device 15 which reduces the residual voltage present across device 15 during ESD current conduction. The reduced voltage protects the systems connected to device 15 from ESD damage. In one embodiment, region 32 forms an anode of the SCR, region 34 forms a cathode of the SCR, and region 29 forms a gate of the SCR.

In order to facilitate the hereinbefore described functionality for device 15, input 12 is commonly connected to a cathode of diode 14 and the emitter of transistor 17. Terminal 20 is commonly connected to the anode of diode 14, and anode of device 21, a first terminal of resistor 19, and the emitter of transistor 18. The collector of transistor 18 is commonly connected to the cathode of device 21 and the base of transistor 17. The collector of transistor 17 is commonly connected to a node 22, the base of transistor 18, and a second terminal of resistor 19.

Figure 5:
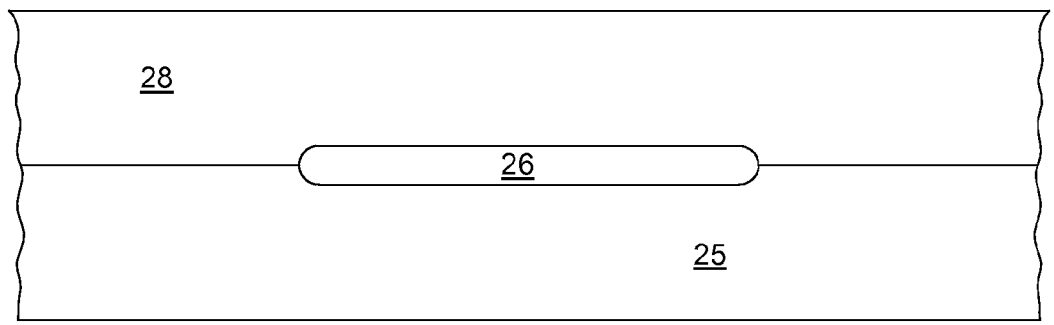
FIG. 5 illustrates a cross-sectional view of the ESD device of FIGS. 1 and 3-4 at one stage of an example of an embodiment of a method of forming the ESD device in accordance with the present invention.

FIG. 5 illustrates a cross-sectional view of device 15 at one stage of an example of an embodiment of a method of forming device 15. A doped region may be formed in a portion of a first surface of substrate 25 near where region 26 is to be formed. Typically, layer 28 is then formed on the first surface of substrate 25. During the formation of layer 28, the dopants that were formed on the first surface of substrate 25 may out-diffuse into substrate 25 and layer 28 to form region 26. In other embodiments, region 26 may be formed by other methods such as during the formation of layer 28, or by molecular beam epitaxy or other means for example.

Figure 6:
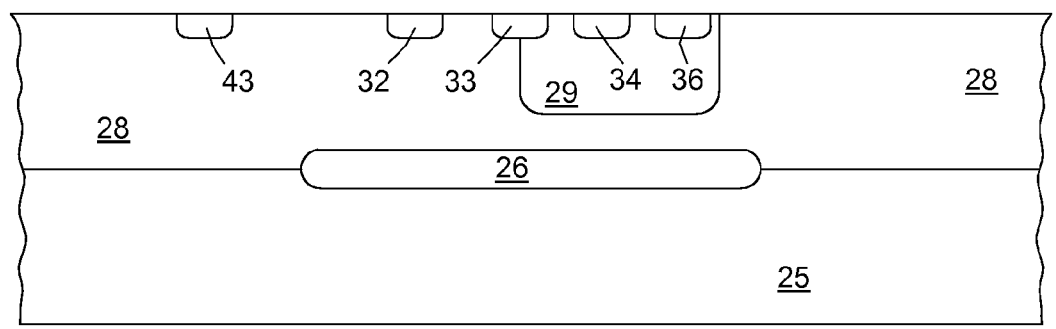
FIG. 6 illustrates a subsequent formation stage according to an example of an embodiment of a method of forming the ESD device of FIGS. 1 and 3-4 in accordance with the present invention.

FIG. 6 illustrates device 15 at a subsequent formation stage according to an example of an embodiment of a method of forming device 15. Region 29 may be formed within region 40 and to extend from a surface of layer 28 into layer 28. Also, regions 32, 33, 34, 36, and 43 may be formed on the surface of layer 28 and to extend a distance into layer 28 or into region 29. In one embodiment, regions 32, 33, 34, 36, and 43 are formed to extend between approximately one-half to one (0.5-1.0) microns into layer 28. Forming the distance very small assists in minimizing the capacitance of diode 14 and the emitter-base capacitance of transistor 17. One embodiment of region 29 extends from the surface of layer 28 into layer 28 a distance that is greater than the distance that regions 34 and 36 extend from the surface of layer 28 into region 29, the distance from region 29 may be approximately three (3) times the distance that regions 34 and/or 36 extend into region 29.

Figure 7:
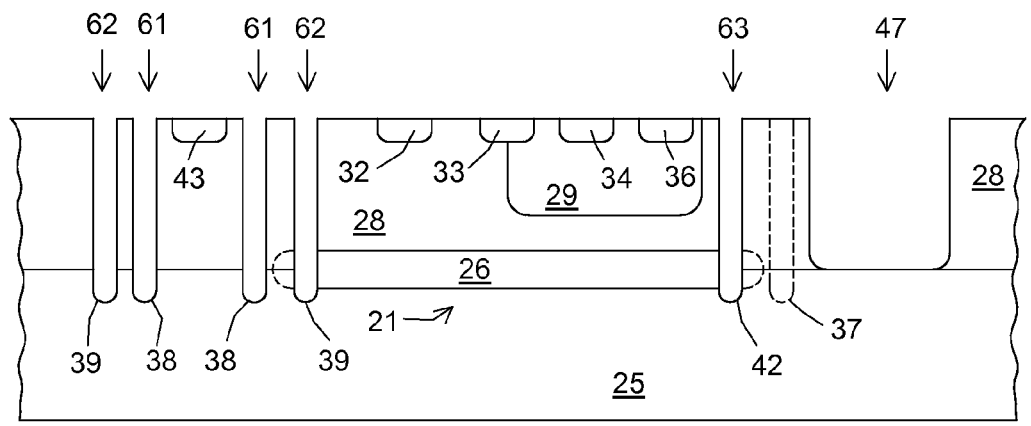
FIG. 7 illustrates another formation stage according to an example of an embodiment of a method of forming the ESD device of FIGS. 1 and 3-4 in accordance with the present invention.

FIG. 7 illustrates device 15 at another subsequent formation stage according to an example of an embodiment of a method of forming device 15. Subsequently, structures 38 and 42, and optional structure 39, may be formed in order to form regions 40 and 41. Typically, openings 61-63 may be formed by creating openings, for example forming trenches, from a top surface of layer 28, through layer 28, and extending into substrate 25. Structures 42 and 38, and 39, also extend through region 26 and may extend a distance into substrate 25 in order to prevent conduction laterally through region 26 between diode 14 and other portions of device 15. Openings 61-63 generally are provided with isolation elements to form openings 61-63 into structures 38, 39, and 42. The isolation elements may be formed by forming an insulator liner or a dielectric liner along the sidewalls and bottoms of openings 61-63 and filling the remaining opening with an insulator or a dielectric or with doped or undoped polysilicon. Alternately, the insulator or dielectric liner may be formed along the sidewalls but not the bottom of openings 61-63 and the remainder of the openings may be filled with an insulator or a dielectric or with a material that has the conductivity and doping of substrate 25. Methods to form openings 61-63 are well known to those skilled in the art. Each of structures 38 and 42, and optionally 39, may be viewed as a blocking structure that minimizes electrical coupling between the enclosed portions and other portions of device 15.

An opening 47 may be formed to facilitate forming conductor 49. Opening 47 may be formed to extend from the surface of layer 28 to the surface of substrate 25 thereby exposing a portion of the surface of substrate 25. Opening 47 may also extend a distance into substrate 25. Opening 47 may be formed at the same time as openings 61-63 or at a different operation.

In some embodiments, an optional structure, such as illustrated by dashed lines 37, may be formed as a closed polygon with a periphery that has an opening which encloses or surrounds all of device 15. Structure 37 may be formed similarly to structures 38 and 42.

Referring back to FIG. 4, an insulator or dielectric 51 may be formed and patterned to electrically isolate portions of the surface of substrate 30 while exposing regions 32-34, 36, and 43. A conductor material may be applied and patterned to form conductor 49 on the surface of substrate 25 and on regions 34 and 36. The patterning may also form conductor 53 electrically connecting regions 43 and 32. In one embodiment, a portion of substrate 25 within opening 47 may be doped (not shown) is assist in providing a low contract resistance to conductor 49. In one embodiment, the material for conductors 49, 53, and 55 are formed simultaneously. In other embodiments, conductor 49 may be formed separately from either or both of conductors 53 and 55. An optional conductor 56 may be formed to make an electrical contact to the portion of region 28 that is within region 41.

Figure 8:
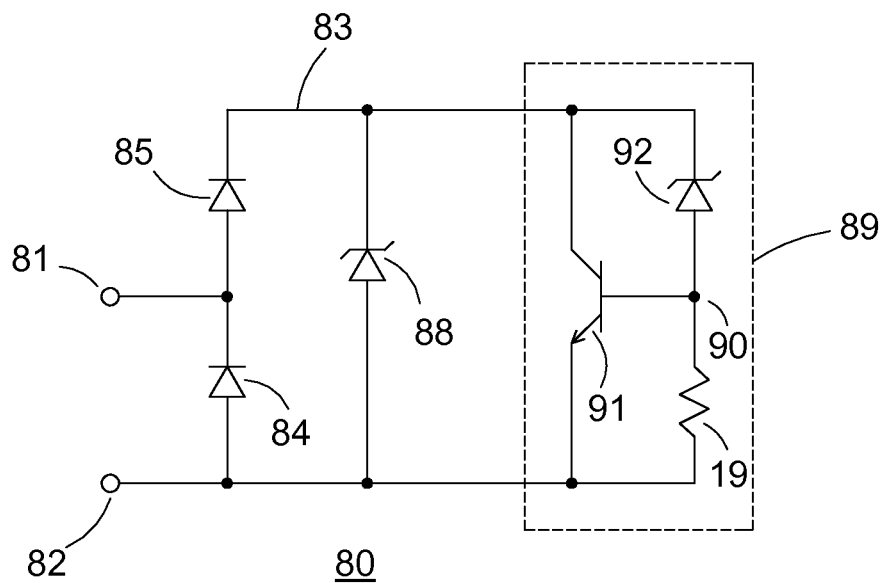
FIG. 8 schematically illustrates an embodiment of a portion of another ESD device that is an alternate embodiment of the ESD device of FIGS. 1 and 3-7 in accordance with the present invention.

FIG. 8 schematically illustrates an embodiment of a portion of an electrostatic discharge (ESD) protection device or ESD device 80 that is an alternate embodiment of device 15. Similarly to device 15, device 80 has a low clamp voltage, a low capacitance and a low dynamic resistance. Device 80 is similar to device 15 except that device 80 includes a pair of input steering diodes, such as diodes 84 and 85, and device 80 does not have a pair of transistors configured in an SCR configuration but has a triggerable bipolar transistor device 89. Diode 84 is similar to diode 14 but diode 84 is connected differently in device 80. Device 80 includes two terminals, an input terminal or input 81 and a second terminal 82, such as a common return. Terminal 82 is similar to terminal 20. Device 80 is configured to provide ESD protection between input 81 and terminal 82 and to form a low clamp voltage therebetween. Device 80 is also configured to have a low capacitance between input 81 and terminal 82.

Device 80 includes a zener diode 88, a transistor 91, and a trigger device 92. Zener diode 88 is formed similarly to the zener diode embodiment of device 21 as described in the description of FIGS. 1-4. As will be seen further hereinafter, zener diode 88 is a parasitic diode formed as a result of the construction of device 80. In one embodiment, device 92 may be formed as a zener diode, in other embodiments device 92 may be other devices that form the trigger device and/or trigger voltage such as a P-N diode or a group of series connected P-N diodes.

Figure 9:
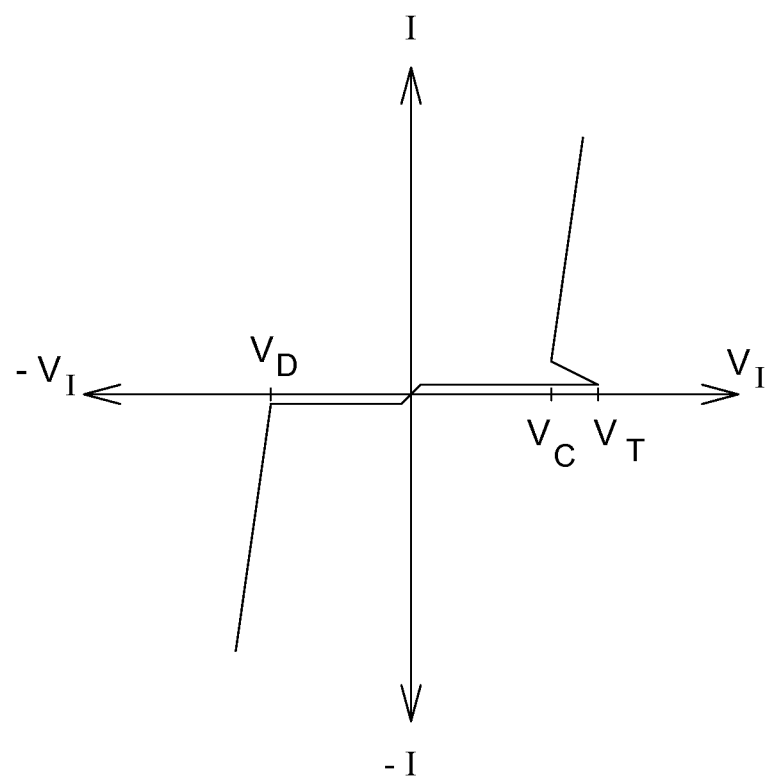
FIG. 9 is a graph that illustrates an example of a V-I characteristic of the ESD device of FIG. 8 in accordance with the present invention.

FIG. 9 is a graph 95 that illustrates an example of a V-I characteristic during operation of an example embodiment of device 80. The abscissa indicates the voltage between input 81 and terminal 82 and the ordinate indicates current flow into input 81. A point labeled Vt illustrates an example of a trigger voltage of device 80. This description has references to FIG. 8 and FIG. 9.

If a positive electrostatic discharge (ESD) event is received on input 81, input 81 is forced to a large positive voltage relative to terminal 82 (referred to a the input voltage). The input voltage forward biases diode 85 and reverse biases diode 84. If the ESD voltage is less than the trigger voltage of device 80 a small current may flow through device 92 and resistor 19 causing a small voltage between the base-emitter of transistor 91, however transistor 91 does not become enabled. As the input voltage reaches the trigger voltage of device 80 (for example, the forward voltage of diode 85 plus the trigger voltage of device 92) device 92 begins to conduct a large current that flows from input 81 through diode 85, device 92, and resistor 19. The current through resistor 19 enables transistor 91 which then conducts a large current. Transistor 91 turns on and conducts most of the current, but the voltage across device 80 remains higher than drop across diode 85 plus the Vcesat of transistor 91 because device 89 and resistor 19 need to remain in conduction to maintain transistor 91 in an enabled state. As illustrated by FIG. 9, here may be a small amount of snapback but not as much as in device 15. The smaller snapback reduces the risk of device latchup in some applications.

In one example embodiment, device 80 was formed to have a trigger voltage and a clamp voltage of approximately four to five volts (4-5V). In one non-limiting example embodiment, device 80 is configured to operate in the normal operating mode for input voltages that are less than the trigger voltage, including for input voltages up to approximately three and three tenths volts (3.3V).

In the event of a negative ESD voltage present across device 80, diode 84 is forward biased and diode 85 is reverse biased. The negative ESD current flows through diode 84. In one non-limiting example embodiment, the voltage across device 80 from return 82 to input 81 during a negative ESD is clamped to a low value of about one to two volts (1-2V).

Figure 10:
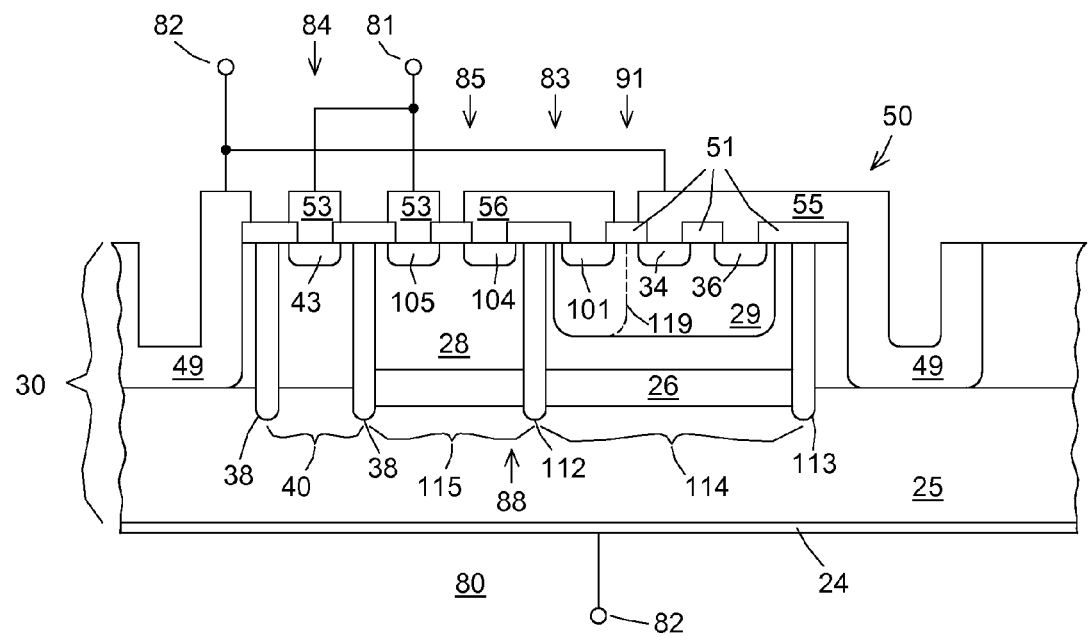
FIG. 10 illustrates an example of an embodiment of a cross-sectional view of the ESD device of FIG. 8 in accordance with the present invention.

FIG. 10 illustrates an example of an embodiment of a cross-sectional view of device 80. Device 80 is formed similarly to device 15 but device 80 does not include region 32 that was described in the description of FIGS. 1-7. Consequently, device 80 does not have transistor 17 but has transistor 91.

Device 80 additionally includes isolation regions 114 and 115 that are formed by respective isolation structures 113 and 112. Structures 112 and 113 are similar to structures 38 and 42 (FIG. 4) except that region 114 includes transistor 91 but does not include a transistor that is similar to transistor 17 (FIG. 4). Additional region 115 is formed as another closed polygon, for example a region that is not within region 40 or 114, having a periphery that surrounds another portion of the layer 28 that is external to the portion of layer 28 surrounded by structure 113. Diode 85 is formed within region 115. Diode 85 is connected between input 81 and a collector of transistor 91. A P-type semiconductor region 105 and an N-type semiconductor region 104 are formed on the surface of layer 28 within region 115 to form diode 85.

Additionally, device 80 may optionally include that conductor 49 is formed as a multiply-connected domain wherein the opening in which conductor 49 is formed surrounds the outer periphery of device 80.

In order to facilitate the hereinbefore described functionality for device 80, input 81 is commonly connected to an anode of diode 85 and a cathode of diode 84. A cathode of diode 85 is commonly connected to a cathode of diode 88, the collector of transistor 91, and a first terminal of device 92. For example, a cathode of a zener diode that may be used for device 92. An anode of diode 84 is commonly connected to terminal 82, an anode of diode 88, the emitter of transistor 91, and a first terminal of resistor 19. A second terminal of resistor 19 is connected to the base of transistor 91 and a second terminal of device 92, for example an anode of a zener diode.

Figure 11:
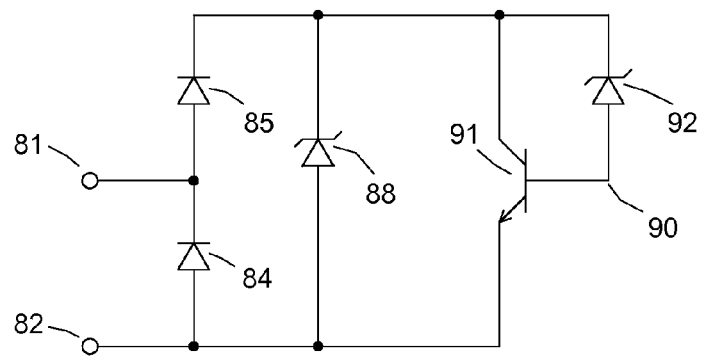
FIG. 11 schematically illustrates an embodiment of a portion of another ESD device that is an alternate embodiment of the ESD devices of FIGS. 8 and 10 in accordance with the present invention.

FIG. 11 schematically illustrates an embodiment of a portion of an electrostatic discharge (ESD) protection device or ESD device 117 that is an alternate embodiment of device 80 that was described in the description of FIGS. 8-10. Device 117 is similar to device 80 except that device 117 does not have a connection between the base of transistor 91 and terminal 82. Device 117 has a much lower trigger voltage than devices 15 or 80. Device 117 is connected similarly to device 80 except that resistor 19 is missing and region 36 may also be omitted.

Referring back to FIG. 10, device 117 is formed similarly to device 80 except that region 29 of device 80 is replaced with a semiconductor region 119 which has a higher doping concentration and may have a narrower width than region 29. For such an embodiment, region 34 is formed in layer 28 but is not within region 119. In one embodiment, the doping concentration of region 119 is approximately ten (10) times the doping concentration of region 29. The doping concentration of region 119 may also be four orders of magnitude greater than the doping concentration of layer 28. This increased doping concentration decrease the trigger voltage of device 117. The trigger voltage of device 117 is controlled by the breakdown voltage of the base-emitter junction of transistor 91. Thus, the base-emitter junction is the trigger device of device 117. Increasing the doping concentration of region 119 decrease the breakdown voltage and provides a lower trigger voltage for device 117.

In one embodiment, region 101 may be the collector of transistor 91, region 119 or region 29 may be the base of transistor 91, and region 34 may be the emitter of transistor 91. Device 92 may include regions 101 and 119 (or 29) and the interface therebetween. Conductor 49 may form a low resistance conduction path of the ESD current from the emitter of transistor 91. An embodiment may omit region 36.

In another embodiment, the distance between regions 101 and 34 may be reduced. The value of the distance is selected to assist in achieving the desired trigger voltage. In one non-limiting embodiment the distance may be less than approximately four (4) microns. In one embodiment, device 117 may have a trigger value that does not respond to an input voltage of approximately three and one-third volts (3.3V).

Figure 12:
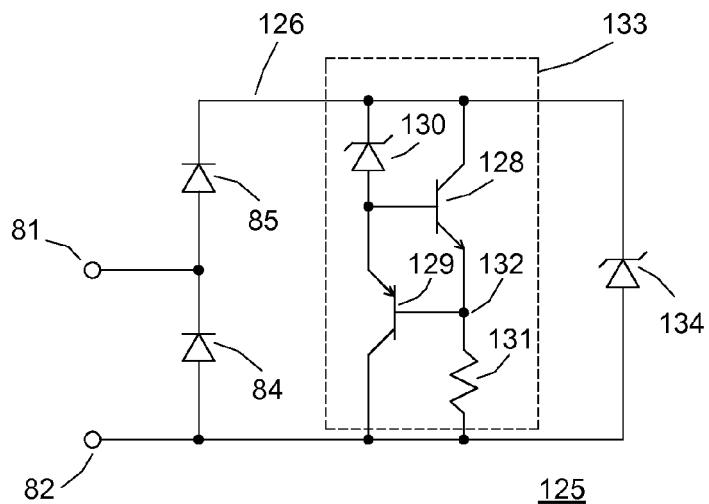
FIG. 12 schematically illustrates an embodiment of a portion of another ESD device that is an alternate embodiment of the ESD devices of FIGS. 1, 3-8, and 10-11 in accordance with the present invention.

FIG. 12 schematically illustrates an embodiment of a portion of an electrostatic discharge (ESD) protection device or ESD device 125 that has a low clamp voltage, a low capacitance and a low dynamic resistance. Device 125 may be an alternate embodiment of devices 15, 80, and 117. Device 125 includes diodes 84 and 85, two transistors 128 and 129 that are configured in an SCR configuration, and a trigger device 130. The SCR configuration of transistors 128 and 129 is illustrated in a general manner as element 133. In one embodiment, device 125 may include an optional zener diode 134.

During a positive ESD event, the voltage between input 81 and terminal 82 increases. As the ESD voltage on input 81 increases but is less than the trigger voltage of device 125, a low value ESD current can flow from input 81 to terminal 82. A first portion of the ESD current can flow from input 81 to the base of transistor 128 via a reverse-biased emitter-base junction of device 130, and resistor a 131. A second portion of the ESD current from input 81 can flow from input 81 and through the collector-to-emitter of transistor 128 as a result of the normal transistor effect.

When the voltage on input 81 reaches the trigger voltage of device 125, device 130 becomes enabled and begins to conduct a large current. For the embodiment of a zener diode for device 130, the voltage on input 81 reaches the zener voltage plus the forward voltage of diode 85. The increased current flow through device 130 enables transistor 128 to conduct a large current. In one embodiment, transistor 128 may be configured to have a high current gain to facilitate such operation. The increased current through transistor 128 flows through resistor 131 to terminal 82. The current flow increases the voltage drop across resistor 131 which eventually becomes large enough to enable transistor 129. Transistor 129 then also conducts current from input 81 to terminal 82. Thus, the trigger voltage is approximately the forward voltage of diode 85 plus the trigger voltage of device 130 plus the forward voltage drop across the base-emitter junctions of transistors 128 and 129.

With transistors 128 and 129 both enabled a self-sustained conduction path may be formed such as is formed in an SCR. This conduction path can carry the entirety of the ESD current from input 81 to terminal 82. Transistors 128 and 129 are operating in the saturation region. The voltage drop across input 81 to terminal 82 reduces to the clamp voltage (Vc) of device 125. The clamp voltage (Vc) from input 81 to terminal 82 becomes the forward voltage of diode 85 plus the saturation voltage of transistors 128 and 129. Thus the clamp voltage (Vc) generally is much less than the trigger voltage (Vt) of device 125. In one non-limiting example embodiment, the clamp voltage (Vc) may be two volts (2V) or less and the threshold voltage may be approximately four to five volts (4-5V). In one embodiment, the input capacitance of device 125 is no greater than approximately one-half of a picofarad (0.5 pf).

Zener diode 134 is formed by the junction between the portion of region 26 within region 115 and the portion of and substrate 25 underlying device 85. The junction isolates device 85 electrically from substrate 25. The breakdown voltage of diode 134 is generally higher than the trigger voltage for device 133.

Figure 13:
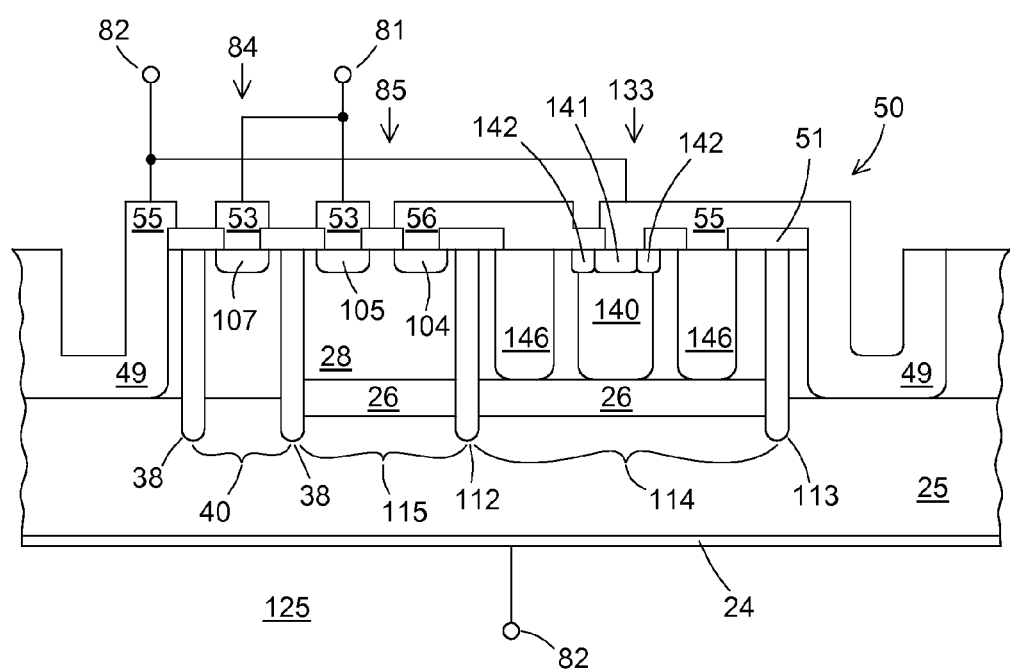
FIG. 13 illustrates an example of an embodiment of a cross-sectional view of the ESD device of FIG. 12 in accordance with the present invention.

FIG. 13 illustrates an example of an embodiment of a cross-sectional view of device 125. Device 125 is formed similarly to device 80 but device 125 does not include region 101 of device 80 (FIG. 8). Device 125 includes a semiconductor region 140 that is similar to region 29 and may similar or different doping characteristics. A semiconductor region 141 is formed within region 140. Region 141 is similar to region 101 and may have similar or different doping characteristics. Device 125 also includes region 26 that functions as the emitter of transistor 128 and as the base of transistor 129. Substrate 25 functions as the collector of transistor 129. A semiconductor region 146 is formed to extend from the surface of layer 28 to region 26 and facilitate forming a low resistance electrical connection to region 26, such as between conductor 49 and region 26. In one embodiment, region 146 may extend into region 26. Region 146 is illustrated as being formed as a multiply connected domain that surrounds a portion of region 26. In other embodiments region 146 may be a single region or multiple regions that does/do not surround the portion of region 26.

In one non-limiting example embodiment, regions 26 and 141 are formed as N-type regions having respective peak doping concentrations of approximately 1E18 to 1E19 and approximately 1E19 to 1E20. In one non-limiting example embodiment region 140 is formed as a P-type region having a peak doping concentration of approximately 1E15 to 1E17. In an optional embodiment, device 125 may include a semiconductor region 142 that is formed within region 114 and abutting region 141. The interface of regions 142 and 141 form the junction of zener diode 134. The doping concentration of region 142 may be greater than the doping concentration of region 140 and may be similar to the doping concentration of region 141. In one embodiment, region 142 touches region 141 which lowers the trigger value for device 125. In another embodiment, region 142 may not touch region 141.

In another embodiment, any one or all of structures 38, 112, and/or 113 may be replaced by a semiconductor region having a conductivity type that is the same as substrate 25 and that extends from the surface of layer 28, through layer 28, and touches or extends into substrate 25.

In order to facilitate the hereinbefore described functionality for device 125, terminal 82 is commonly connected to the anode of diode 84, the collector of transistor 129, a first terminal of resistor 131 and optionally to an anode of diode 134. A second terminal of resistor 131 is commonly connected to the base of transistor 129 and the emitter of transistor 128. The collector of transistor 128 is commonly connected to a first terminal of device 130, for example a cathode of a zener diode, and a cathode of diode 85. The emitter of transistor 129 is commonly connected to the base of transistor 128 and a second terminal of device 130, for example an anode of a zener diode.

Those skilled in the art will appreciate that in one embodiment, an ESD device may comprise:

an input (such as one of inputs 12 or 81 for example) of the ESD device;

a common return (such as one of returns 20 or 82 for example) of the ESD device;

a semiconductor substrate of a first conductivity type;

a first semiconductor layer (for example one of layers 28 or 97) of a second conductivity type on the semiconductor substrate and having a first doping concentration;

a first blocking structure, such as one of structures 39 and/or 42 or 112 and/or 113, formed as a first closed polygon having a periphery that surrounds a first portion for example portion 41 or 114, of the first semiconductor layer;

a first transistor such as one of transistors 17, 91, or 128 for example, formed on the first semiconductor layer and within the first portion of the semiconductor substrate, the first transistor having a first current carrying electrode coupled to one of the input or the common return, the first transistor having a control electrode and a second current carrying electrode;

a first semiconductor region, such as one of regions 29, 98, or 140 for example, of the first conductivity type within the first portion of the first semiconductor layer, wherein the first semiconductor region forms a portion of the first transistor, the first semiconductor region having a second doping concentration that is greater than the first doping concentration of the first semiconductor layer;

a first low capacitance diode, for example one of diodes 14 or 85, formed on the first semiconductor layer and external to the first portion of the semiconductor substrate, the first low capacitance diode coupled in series between the input and the first current carrying electrode of the first transistor;

a first conductor having a first conductor portion formed in an opening that extends through the first semiconductor layer to a portion of the semiconductor substrate and physically and electrically contacting a portion of the semiconductor substrate, the first conductor having a second conductor portion electrically coupled to the second current carrying electrode of the first transistor; and a trigger device, such as one of devices 21, 92, or 130 for example, formed on the first semiconductor layer and within the first portion of the first semiconductor layer, the trigger device having a trigger voltage and coupled to the control electrode of the first transistor wherein the trigger device is configured to enable the first transistor responsively to the input of the ESD device receiving a voltage that is no less than the trigger voltage of the trigger device.

Another embodiment may also include a second semiconductor region, for example one of regions 26 or 136, of the second conductivity type within the first portion of the first semiconductor layer and positioned between the first semiconductor region and the semiconductor substrate.

Another embodiment may include a third semiconductor region, for example region 33, of the second conductivity type formed within the first semiconductor layer, the third semiconductor region extending no greater than about one micron into the first semiconductor layer wherein the third semiconductor region forms a second current carrying electrode of the second transistor.

An embodiment may include a fourth semiconductor region, such as region 32 for example, of the first conductivity type formed within the first semiconductor layer, the third semiconductor region extending no greater than about one micron into the first semiconductor layer wherein the fourth semiconductor region may form the first current carrying electrode of the first transistor and wherein the third semiconductor region may be position between the fourth semiconductor region and the first semiconductor region.

Another embodiment may include a third semiconductor region, for example region 100, of the second conductivity type within the first semiconductor region, the third semiconductor region extending no greater than about one micron into the first semiconductor region wherein the second semiconductor region forms the second current carrying electrode of the first transistor.

In another embodiment, the ESD device may include that the first doping concentration is less than approximately 1E13 and the second doping concentration is one of between approximately 1E16-1E17 and approximately 1E17-1E18.

Another embodiment of the ESD device may include that the first doping concentration is between approximately 1E12 and 1E13 and the second doping concentration is between approximately 1E16-1E18.

In an embodiment, the ESD device may include that the first doping concentration is less than approximately 1E13, the second doping concentration is between approximately 1E16-1E18, and the third doping concentration is between approximately 1E19-1E20.

In another embodiment, the ESD device may include a second semiconductor region (such as region 34 for example) of the second conductivity type formed within the first semiconductor region, the second semiconductor region extending no greater than about one micron into the first semiconductor region and having a third doping concentration that is greater than the second doping concentration.

Another embodiment may include that the second conductor portion is electrically coupled to the first semiconductor region.

In another embodiment, the first transistor may be a portion of an SCR that includes a second transistor, such as one of transistors 18 or 129 for example, formed in the first portion of the first semiconductor layer wherein the first semiconductor region forms the second current carrying electrode of the first transistor and a control electrode of the second transistor and wherein the first portion of the first semiconductor layer forms the control electrode of the first transistor.

In one embodiment, the ESD device may include a second semiconductor region, such as one of regions 101 or 141 for example, of the second conductivity type formed within the first semiconductor region, the second semiconductor region extending no greater than about one micron into the first semiconductor region wherein the second semiconductor region forms the first current carrying electrode of the first transistor and the first semiconductor region forms the control electrode of the first transistor and wherein a portion of the trigger device is formed at a junction between the first and second semiconductor regions.

An embodiment may include a second blocking structure, such as the structure that forms region 114 for example, formed as a second closed polygon having a periphery that surrounds a second portion of the first semiconductor layer that is external to the first portion of the first semiconductor layer, a second low capacitance diode formed within the second portion of the first semiconductor layer, the second low capacitance diode coupled between the input and the second current carrying electrode of the first transistor.

Another embodiment of the ESD device may include a third semiconductor region, for example region 142, of the first conductivity type within the first semiconductor region and abutting the second semiconductor region.

Those skilled in the art will appreciate that one embodiment of a method of forming an ESD device may comprise:

providing a semiconductor substrate of a first conductivity type, the semiconductor substrate having a first surface and a second surface;

forming a first semiconductor layer, such as one of layers 28 or 97 for example, of a second conductivity type on the first surface of the semiconductor substrate, the first semiconductor layer having a first peak doping concentration;

forming a first semiconductor region, region 26 for example, of the second conductivity type positioned between the semiconductor substrate and the first semiconductor layer, the first semiconductor region having a second peak doping concentration that is greater than the first peak doping concentration wherein at least a portion of the first semiconductor region forms a first zener diode, such as one of diodes 21 or 88 for example,) with the semiconductor substrate;

forming a second semiconductor region, such as one of regions 29, 98, or 140 for example, within a first portion of the first semiconductor layer, the second semiconductor region having the first conductivity type and a second peak doping concentration that is greater than the first peak doping concentration, wherein the second semiconductor region forms a control electrode of a first transistor;

forming a first isolation structure, such as one of structures 39 and/or 42 or 112 and/or 113 for example, surrounding a periphery of the first portion of the first semiconductor region;

forming a third semiconductor region, such as one of regions 34, 101, or 141 for example, within the second semiconductor region with the third semiconductor region having the second conductivity type wherein the third semiconductor region forms a first current carrying electrode of the first transistor, such as one of the emitter of transistor 18, the emitter of transitory 91, the collector of transistor 118, and/or the collector of transistor 128 for example; and forming a second isolation structure, such as structure 38 for example, surrounding a periphery of a second portion of the first semiconductor region that is external to the first portion of the first semiconductor region wherein the second portion of the first semiconductor region forms a first diode, one of diodes 14 or 84 for example, having a first electrode, for example an anode, coupled to the first electrode of the first zener diode and having a second electrode coupled to an input, such as one of inputs 12 or 81 for example, of the ESD device.

Another embodiment of the method may include, forming an opening extending through a third portion of the first semiconductor layer that is external to the first and second portions of the first semiconductor layer wherein the opening exposes a portion of the semiconductor substrate, and forming a first conductor, such as conductor 49 for example, on the exposed portion of the semiconductor substrate and electrically connecting the semiconductor substrate to one of the first current carrying electrode of the first transistor or a second current carrying electrode of the first transistor.

one embodiment of the method may include forming a fourth semiconductor region, such as region 32 for example, of the first conductivity type in the first portion of the first semiconductor region and spaced apart from the second semiconductor region, wherein the fourth semiconductor region forms a first current carrying electrode of a second transistor, such as the emitter of transistor 17 for example, wherein the first portion of the first semiconductor region forms a control electrode of the second transistor that is coupled to a first electrode, such as a cathode for example, of the first zener diode, wherein the first current carrying electrode of the first transistor is coupled to a second electrode, for example an anode, of the first zener diode, wherein the second semiconductor region forms a second current carrying electrode of the second transistor coupled to the control electrode of the first transistor, and wherein the first and second transistors form an SCR.

Another embodiment of the method may include forming a fifth semiconductor region, such as region 33 for example, in the first portion of the first semiconductor region and spaced apart from the fourth semiconductor region, wherein the fifth semiconductor region forms a second current carrying electrode of the first transistor, such as the collector of transistor 18 for example.

In an embodiment, the method may include forming a fourth semiconductor region, for example region 101, in the first portion of the first semiconductor region wherein the fourth semiconductor region forms a second current carrying electrode of the first transistor, such as the collector of transistor 91 for example, and wherein the third semiconductor region forms a second zener diode, for example diode 92, with the second semiconductor region that is coupled to the first current carrying electrode and to the control electrode of the first transistor; and forming the second peak doping concentration at least approximately four orders of magnitude greater than the first peak doping concentration.

Those skilled in the art will appreciate that an embodiment of a method of forming an ESD device may comprise:

providing a semiconductor substrate;

forming a semiconductor layer, such as layer 28 for example, overlying at least a portion of the semiconductor substrate;

forming a first blocking structure, such as one of structures 39 and/or 42, around a first portion of the semiconductor layer;

forming at least a portion of an SCR within the first portion of the semiconductor layer;

forming an opening, such as opening 47 for example, in the semiconductor layer to expose a portion of the semiconductor substrate;

forming a conductor, for example conductor 49, to ohmically contact one of an anode, such as an anode of device 125 for example, or a cathode, such as a cathode of device 15 for example, of the SCR and to extend to electrically contact the portion of the semiconductor substrate to provide an ohmic electrical connection therebetween;

forming a second blocking structure, such as structure 38 for example, around a second portion of the semiconductor layer; and forming a low capacitance diode, such as diode 14 for example, in the second portion of the semiconductor layer and connected electrically to the SCR.

Another embodiment of the method may include forming the SCR to extend into the semiconductor substrate.

An embodiment of the method may include forming an anode, such as the anode of diode 14 for example, of the low capacitance diode coupled to the cathode, such as region 34 for example, of the SCR through the conductor.

Another embodiment of the method may include forming a trigger device of the SCR surrounded by the first blocking structure wherein at least a portion of the trigger device is within the first portion the first semiconductor layer.

In view of all of the above, it is evident that a novel device and method is disclosed. Included, among other features, is forming an ESD device that has a low clamp voltage, a low capacitance and a low dynamic resistance. Forming the depth of region 29 greater than the depth of region 34 and or regions 32-33 facilitates accurately controlling the control gain voltage of a transistor of the ESD device???. Forming a trigger device to control the trigger voltage and enable a transistor or a transistor of an SCR facilitates forming a low clamp voltage yet having a high trigger voltage thereby providing greater protection for devices that may be connected to the ESD device. Forming a low resistance connection between the substrate and devices formed on other layers of the ESD device facilitates reducing the dynamic resistance of the ESD device.

While the subject matter of the descriptions are described with specific preferred embodiments and example embodiments, the foregoing drawings and descriptions thereof depict only typical and examples of embodiments of the subject matter and are not therefore to be considered to be limiting of its scope, it is evident that many alternatives and variations will be apparent to those skilled in the art. As will be appreciated by those skilled in the art, the example form of devices 15, 80, 117, and 125 are used as a vehicle to explain the operation method of forming and using the ESD device. In some embodiments, resistor 19 may be omitted.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A method of forming an ESD device comprising:
providing a semiconductor substrate of a first conductivity type, the semiconductor substrate having a first surface and a second surface;
forming a first semiconductor layer of a second conductivity type on the first surface of the semiconductor substrate, the first semiconductor layer having a first peak doping concentration;
forming a first semiconductor region of the second conductivity type positioned between the semiconductor substrate and the first semiconductor layer, the first semiconductor region having a second peak doping concentration that is greater than the first peak doping concentration wherein at least a portion of the first semiconductor region forms a first zener diode with the semiconductor substrate;
forming a second semiconductor region of the first conductivity type within a first portion of the first semiconductor layer, the second semiconductor region having a second peak doping concentration that is greater than the first peak doping concentration, wherein the second semiconductor region forms a control electrode of a first transistor;
forming a first isolation structure surrounding a periphery of the first portion of the first semiconductor region;
forming a third semiconductor region within the second semiconductor region with the third semiconductor region having the second conductivity type wherein the third semiconductor region forms a first current carrying electrode of the first transistor; and
forming a second isolation structure surrounding a periphery of a second portion of the first semiconductor region that is external to the first portion of the first semiconductor region wherein the second portion of the first semiconductor region forms a first diode having a first current carrying electrode coupled to the first current carrying electrode of the first zener diode and having a second current carrying electrode coupled to an input of the ESD device.

2. A method of forming an ESD device comprising:
providing a semiconductor substrate of a first conductivity type, the semiconductor substrate having a first surface and a second surface;
forming a first semiconductor layer of a second conductivity type on the first surface of the semiconductor substrate, the first semiconductor layer having a first peak doping concentration;
forming a first semiconductor region of the second conductivity type positioned between the semiconductor substrate and the first semiconductor layer, the first semiconductor region having a second peak doping concentration that is greater than the first peak doping concentration wherein at least a portion of the first semiconductor region forms a first zener diode with the semiconductor substrate;
forming a second semiconductor region within a first portion of the first semiconductor layer, the second semiconductor region having the first conductivity type and a second peak doping concentration that is greater than the first peak doping concentration, wherein the second semiconductor region forms a control electrode of a first transistor;
forming a first isolation structure surrounding a periphery of the first portion of the first semiconductor region;
forming a third semiconductor region within the second semiconductor region with the third semiconductor region having the second conductivity type wherein the third semiconductor region forms a first current carrying electrode of the first transistor;
forming a second isolation structure surrounding a periphery of a second portion of the first semiconductor region that is external to the first portion of the first semiconductor region wherein the second portion of the first semiconductor region forms a first diode having a first current carrying electrode coupled to the first current carrying electrode of the first zener diode and having a second current carrying electrode coupled to an input of the ESD device; and
forming an opening extending through a third portion of the first semiconductor layer that is external to the first and second portions of the first semiconductor layer wherein the opening exposes a portion of the semiconductor substrate, and forming a first conductor on the exposed portion of the semiconductor substrate and electrically connecting the semiconductor substrate to one of the first current carrying electrode of the first transistor or a second current carrying electrode of the first transistor.

3. The method of claim 1 further including forming a fourth semiconductor region of the first conductivity type in the first portion of the first semiconductor region and spaced apart from the second semiconductor region, wherein the fourth semiconductor region forms a first current carrying electrode of a second transistor, wherein the first portion of the first semiconductor region forms a control electrode of the second transistor that is coupled to a first current carrying electrode of the first zener diode, wherein the first current carrying electrode of the first transistor is coupled to a second electrode of the first zener diode, wherein the second semiconductor region forms a second current carrying electrode of the second transistor coupled to the control electrode of the first transistor, and wherein the first and second transistors form an SCR.

4. The method of claim 3 further including forming a fifth semiconductor region in the first portion of the first semiconductor region and spaced apart from the fourth semiconductor region, wherein the fifth semiconductor region forms a second current carrying electrode of the first transistor.

5. The method of claim 1 further including forming a fourth semiconductor region in the first portion of the first semiconductor region wherein the fourth semiconductor region forms a second current carrying electrode of the first transistor and wherein the third semiconductor region forms a second zener diode with the second semiconductor region that is coupled to the first current carrying electrode and to the control electrode of the first transistor; and wherein forming the second semiconductor region includes forming the second peak doping concentration at least approximately four orders of magnitude greater than the first peak doping concentration.

6. The method of claim 5 further including forming a forming a third isolation structure surrounding a periphery of a third portion of the first semiconductor region that is external to the first portion and the second portion of the first semiconductor region;

forming a second diode in the third portion of the first semiconductor region including forming a fifth semiconductor region of the first conductivity type in the third portion of the first semiconductor region wherein the fifth semiconductor region forms a first electrode of the second diode that is coupled to the input of the ESD device; and forming a sixth semiconductor region of the second conductivity type in the third portion of the first semiconductor region wherein the sixth semiconductor region forms a second electrode of the second diode that is coupled to the first electrode of the first zener diode.

7. The method of claim 1 further including forming a fourth semiconductor region in the second semiconductor region wherein the fourth semiconductor region forms a second current carrying electrode of the first transistor and wherein the third semiconductor region forms a second zener diode with the second semiconductor region that is coupled to the first current carrying electrode and to the control electrode of the first transistor.

8. The method of claim 1 further including forming a fourth semiconductor region of the first conductivity type in the second semiconductor region and abutting the third semiconductor region wherein the fourth semiconductor region forms a second zener diode with the third semiconductor region, wherein the fourth semiconductor region forms a first current conductor of the second zener diode that is coupled to a control electrode of the first transistor and the third semiconductor region forms a second current conductor of the second zener diode that is coupled to the first current carrying electrode of the first transistor.

9. The method of claim 8 wherein forming the first semiconductor region includes forming the first semiconductor region extending from the first surface of the semiconductor substrate toward the second semiconductor region including forming an SCR wherein the first semiconductor region forms a second current carrying electrode of the first transistor and a control electrode of a second transistor, wherein the second semiconductor region forms a first current carrying electrode of the second transistor that is coupled to the control electrode of the first transistor, wherein the semiconductor substrate forms a second current carrying electrode of the second transistor, and wherein the first and second transistors are formed as an SCR.

10. A method of forming an ESD device comprising:
providing a semiconductor substrate;
forming a semiconductor layer overlying at least a portion of the semiconductor substrate;
forming a first blocking structure substantially surrounding a first portion of the semiconductor layer;
forming at least a portion of an SCR within the first portion of the semiconductor layer;
forming a second blocking structure substantially surrounding a second portion of the semiconductor layer;
forming a low capacitance diode in the second portion of the semiconductor layer and connected electrically to the SCR;
forming an opening in the semiconductor layer to expose a portion of the semiconductor substrate including forming the opening to surround the first and second blocking structures;
forming a conductor within the opening to ohmically contact one of an anode or a cathode of the SCR and to extend to electrically contact the portion of the semiconductor substrate to provide an ohmic electrical connection therebetween.

11. The method of claim 10 wherein forming at least the portion of the SCR includes forming the SCR to extend into the semiconductor substrate.

12. The method of claim 10 wherein forming the low capacitance diode includes forming an anode of the low capacitance diode coupled to the cathode of the SCR through the conductor.

13. The method of claim 10 forming a trigger device of the SCR surrounded by the first blocking structure wherein at least a portion of the trigger device is within the first portion the first semiconductor layer.

14. The method of claim 1 wherein forming the second semiconductor region includes forming a portion of the second semiconductor region having the first conductivity type to underlie the third semiconductor region.

* * * * *